United States Patent [19]
Roither

[11] Patent Number: 5,636,249
[45] Date of Patent: Jun. 3, 1997

[54] METHOD OF AND APPARATUS FOR PHASE SYNCHRONIZATION WITH AN RDS SIGNAL

[75] Inventor: Gerhard Roither, Müchen, Germany

[73] Assignee: SGS-Thomson Microelectronics GmbH, Grasbrunn, Germany

[21] Appl. No.: 567,880

[22] Filed: Dec. 8, 1995

[30] Foreign Application Priority Data

Dec. 8, 1994 [DE] Germany ............... 44 43 790.0

[51] Int. Cl.$^6$ ................................. H04L 27/10
[52] U.S. Cl. ............... 375/282; 375/373; 375/371; 375/375; 329/307
[58] Field of Search ........................ 375/322, 327, 375/354, 355, 371, 373, 282; 370/47, 100.1; 329/307, 309, 310; 455/186.1

[56] References Cited

U.S. PATENT DOCUMENTS

| | | | |
|---|---|---|---|
| 3,805,180 | 4/1974 | Widmer | 331/1 A |
| 4,222,013 | 9/1980 | Bowers et al. | 331/1 A |
| 5,001,728 | 3/1991 | Fuldner | 375/328 |
| 5,399,987 | 3/1995 | Yamamoto et al. | 329/306 |
| 5,450,450 | 9/1995 | Lee | 375/354 |
| 5,497,126 | 3/1996 | Kosiec et al. | 331/1 A |

OTHER PUBLICATIONS

Dietze, Andreas, "SDA 1000 Decodes Radio Data Signals," *Siemens Components*, vol. 25, No. 3, Jul. 1990, pp. 86–91.
*Speziftkation des Radio–Daten–Systems* (RDS), Deutsche Fassung EN 50067:1992, DIN (German Institute for Standardization), Beuth Verlag GMBH, Berlin, Feb. 1993, pp. 3–5, 14, 62–64.
*Specifications of the Radio Data System RDS for VHF/FM Sound Broadcasting*, Tech. 3244–E, Technical Centre of the European Broadcasting Union, Bruxelles, Belgium, Mar. 1984, pp. 1–12.

*Primary Examiner*—Stephen Chin
*Assistant Examiner*—Muhammad Ghayour
*Attorney, Agent, or Firm*—David V. Carlson; Harry K. Ahn; Seed and Berry LLP

[57] ABSTRACT

A method of and an apparatus for phase synchronization of a bit rate clock signal generated in an RDS receiver with a digital RDS signal demodulated on the receiver side, in which both the bit rate clock signal and the RDS signal have the same bit rate. Upon turning on of the RDS receiver and/or switching over of the same to a transmitter receiving frequency different from that received so far, a control signal is generated which, upon occurrence of the next rising edge or, alternatively, of the next falling edge of the RDS signal, effects such a phase angle shift of the bit rate clock signal that the bit rate clock signal, starting from that occurrence, is in phase synchronism with the RDS signal.

23 Claims, 1 Drawing Sheet

METHOD OF AND APPARATUS FOR PHASE SYNCHRONIZATION WITH AN RDS SIGNAL

TECHNICAL FIELD

The invention relates to a method of and an apparatus for phase synchronization of a bit rate clock signal generated in an RDS receiver with a digital RDS signal that is demodulated on the receiver side, with the bit rate clock signal and the RDS signal having the same bit rate.

BACKGROUND OF THE INVENTION

RDS is an abbreviation for Radio Data System. This is a standardized system in Europe for transmitting broadcasting or radio station information to radio receivers. Such radio station information, hereinafter also referred to as RDS information, in coded manner transmits the name or part of the name of the radio station sending the RDS information as well as information on additional frequencies via which the program of this radio station is broadcast. With the aid of the RDS signal it is possible on the one hand to display the name of the station received at the moment on a display of a radio receiver equipped for RDS, and on the other hand it is possible for the radio receiver, when the radio signal of the just received radio station cannot be received any more with sufficient quality on the transmitter receiving frequency set at the particular moment, to automatically switch over to a different transmitter frequency on which the same program of the same station is transmitted.

More details on the RDS system are described in the publication "Specifications of the Radio Data System RDS for VHF/FM Sound Broadcasting", Tech. 3244-E, Technical Centre of the European Broadcasting Union Brussels, March 1984.

The RDS data is modulated onto a carrier frequency of 57 kHz by a biphase modulation. This carrier frequency is not transmitted to the receiver. Due to the fact that RDS information is transmitted in the form of an asynchronous pulse sequence, the carrier frequency of 57 kHz must be produced on the receiver side. Upon synchronous demodulation on the receiver side with the aid of the carrier frequency of 57 kHz produced on the receiver side, the RDS information is present in the form of a digital biphase signal. For obtaining the RDS data on the receiver side, the bit rate clock signal has to be recovered on the receiver side. To this end, a so-called Costas circuit is usually employed.

Each bit of the digital RDS signal that is demodulated on the receiver side is composed of two half bits, with a digital transition from 0 to 1 or from 1 to 0 occurring between the first and second half bits of each RDS bit. The direction in which the transition from the first to the second half bit takes place is dependent on whether the particular RDS bit serves to transmit the logic value "1" or the logic value "0". At the transition between two adjacent RDS bits, a transition from 0 to 1 or from 1 to 0 occurs only when the adjacent RDS bits transmit the same logic value. When adjacent RDS bits transmit different logic values, no transition from 0 to 1 or vice versa will take place between them.

In order to be able to safely recover the RDS information on the receiver side, the digital RDS signal that is demodulated on the receiver side and the bit rate clock signal produced on the receiver side do not only need to have the same bit rate, but they must also be in phase synchronism. This is effected by means of a PLL. Upon turning on a radio receiver or tuning thereof to a different transmitter receiving frequency than that received so far, the PLL needs a certain time for latching to the new transmitter receiving frequency, i.e., after such switching on or over it takes a certain time until phase synchronization is established between the digital RDS signal demodulated on the receiver side and the bit rate clock signal produced on the receiver side. The latching time within which such phase synchronization is established is about 20 ms in practical applications.

The quality of an RDS demodulator depends, among other things, on the latching time. Thus, attempts are made that the period until which phase synchronization is established after switching on or over be made as short as possible.

SUMMARY OF THE INVENTION

Therefore, it is an object of the present invention to reduce as much as possible the time required for establishing phase synchronization.

According to the principles of the present invention, upon switching on of the RDS receiver and/or switching over of the same to a different transmitter receiving frequency than that received so far, a control signal is generated effecting such a phase angle shift of the bit rate clock signal upon occurrence of the next rising edge of the RDS signal or, alternatively, of the next falling edge of the RDS signal, that the bit rate clock signal as of then is in phase synchronism with the RDS signal.

For producing the bit rate clock signal, an oscillator signal generated on the receiver side, preferably the 57 kHz signal, can be divided down to the frequency of the bit rate clock signal by means of a frequency divider counter. Upon occurrence of the rising or falling edge of the RDS signal following switching on or over of the RDS receiver, respectively, a control signal sets the frequency divider counter to a predetermined count at which the bit rate clock signal has a rising or a falling edge, respectively, equal to that of the RDS signal.

The edge of the RDS signal at which the frequency divider counter is set to its predetermined count preferably is synchronized with a correspondingly directed edge of the oscillator signal. The control signal produced upon switching on or over of the RDS receiver may be stored temporarily and may be released for phase angle shift of the bit rate clock signal by occurrence of the rising or falling edge of the RDS signal. The temporary storing of the control signal may be released again during the process of phase angle shift of the bit rate signal. In a preferred embodiment, the control signal is generated at the next falling edge of the RDS signal following switching on and/or over, and the frequency divider counter due to the control signal is reset to its initial count, for example to count 0.

Due to the fact that the occurrence of the falling or rising edge of the bit rate clock signal following switching on and/or over of the RDS receiver brings the bit rate clock signal instantaneously into phase synchronization with the RDS signal, latching takes place instantaneously. The period required for reaching phase synchronization, with the method according to the invention, is as short as the duration of a half bit. The bit rate clock signal usually is obtained by frequency division of the 57 kHz signal by division factor 48 and thus has a bit rate of 1187.5 Hz. The time required by the method of the invention until phase synchronization is obtained therefore is at the most about 0.4 ms and thus is considerably shorter than the latching time of about 20 ms that was needed previously.

BRIEF DESCRIPTION OF THE DRAWINGS

The invention will now be elucidated by way of embodiments with reference to the accompanying drawings, wherein:

FIG. 1 shows two signal patterns a and b. Signal pattern a shows a bit rate clock signal produced on the receiver side, and b shows a digital RDS signal demodulated on the receiver side. For recovery of the RDS carrier which is not co-transmitted from the transmitter to the receiver, an oscillator signal OS of 57 kHz is generated on the receiver side with the aid of an oscillator. By frequency division with a division factor of 48, this signal becomes a bit rate clock signal having a bit rate or pulse frequency of 1187.5 Hz.

Figure 1:
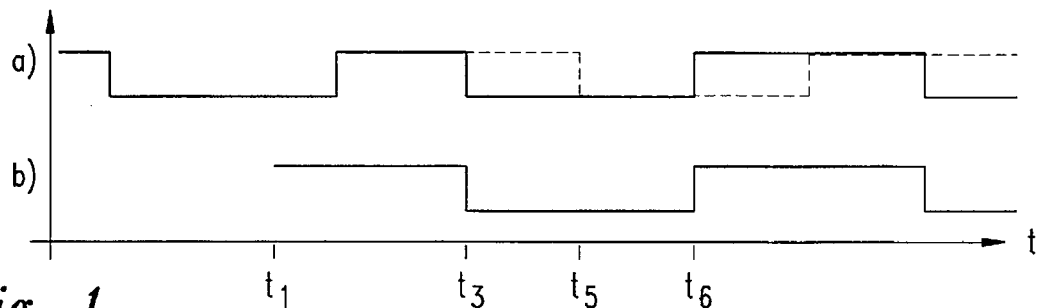
FIG. 1 is an illustration of the bit rate clock signal a and an RDS bit signal b.

It is assumed in FIG. 1 that, at the time t1, the receiver is turned on or changed over to a different transmitter receiving frequency from that received so far. This moment t1 is within the duration of a half bit of the bit rate clock signal a with low signal value. RDS signal b has a high signal value at the time t1.

At the time t3, the RDS signal exhibits a 1 to 0 transition from a high to a low signal value. Bit rate clock signal a, in accordance with the not synchronized clock signal illustrated in broken lines, normally would have a 1 to 0 transition from a high to a low signal value only at a time t5. The phase synchronization which is reached when signal value transitions having the same direction of bit rate clock signal and RDS signal are identical with each other, usually is effected in the prior art by a PLL that produces a phase shift until phase synchronization is obtained. This usually requires many cycles.

In contrast thereto, according to the invention, the bit rate clock signal at the time t3, i.e., at the time of the 1 to 0 transition of the RDS signal, is instantaneously shifted by such a phase angle that the next 1 to 0 transition thereof with falling edge, which actually would be due at the time t5 only, now coincides with moment of time t3. When the RDS signal b then has its next edge change at the time t6, a corresponding edge change occurs in bit rate signal a as well, since the RDS signal and the bit rate clock signal have the same half bit duration.

The instantaneous phase synchronization of the bit rate clock signal with the RDS signal at the time t3 is achieved in a preferred embodiment of the invention in that a frequency divider counter, with the aid of which the bit rate clock signal is produced from oscillator signal OS, upon occurrence of the falling edge of the RDS signal at the time t3 is instantaneously set to such a count, preferably an initial count or count 0, at which the corresponding edge of the bit rate clock signal is present at the output of the frequency divider counter.

It can be seen from FIG. 1 that the phase synchronization of the bit rate clock signal with the RDS signal takes place in virtually instantaneous manner upon switching on or over of the RDS receiver, namely within a period that is at most as long as a half bit.

Figure 2:
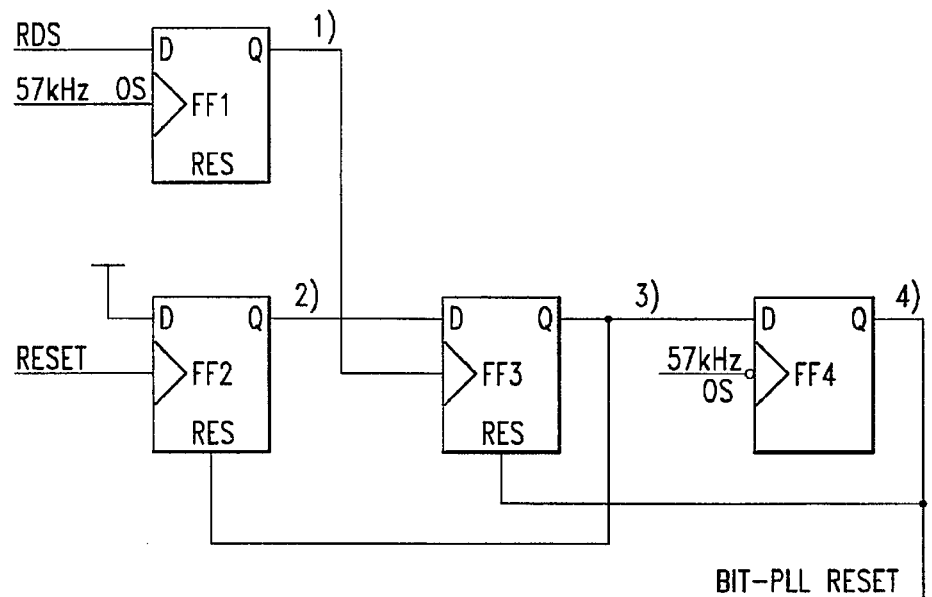
FIG. 2 is a block diagram of an apparatus for phase synchronization according to the invention.

One embodiment of a phase synchronization apparatus according to the invention is shown in FIG. 2 in a block diagram. It comprises four D-type flip-flops FF1 to FF4 and a frequency divider FT.

The D-type input of FF1 is fed with the digital RDS signal that is demodulated on the receiver side. The clock input of FF1 has the 57 kHz oscillator signal applied thereto. The Q output of FF1 is connected to the clock input of FF3.

The D-type input of FF2 is permanently on supply potential, i.e., it is permanently on a logic high digital signal value. The clock input of FF2 is connected to the output of a control circuit (not shown) which, upon switching on or over of the RDS receiver to a transmitter receiving frequency different from that received so far, issues a control signal designated RESET in FIG. 2. The control signal preferably is generated by a microprocessor which also performs the control operations upon switching on of the RDS receiver or switching over of the same to a different transmitter receiving frequency. The microprocessor "knows" when such switching on or over takes place and thus can deliver the control signal RESET at the correct moment of time.

The D-type input of FF3 is connected to the Q output of FF2. As mentioned hereinbefore, the clock input thereof is connected to the Q output of FF1. The Q output of FF3 is connected on the one hand to a resetting input RES of FF2 and on the other hand to the D-type input of FF4. The 57 kHz oscillator signal OS is applied to the clock input of FF4. The Q output of FF4 is connected on the one hand to a resetting input RES of FF3 and on the other hand to a resetting input RES of frequency divider FT.

The 57 kHz oscillator signal is applied to a clock counting input of frequency divider FT. This signal is divided by frequency divider FT to the 1187.5 Hz bit rate clock signal available at the output of frequency divider FT.

D-type flip-flop FF2 acts as a temporary storage for the control signal RESET. This control signal is made available at the Q output of FF2 until FF2 is reset by a signal change at the Q output of FF3 and temporary storage of the control signal RESET is thus canceled. FF1 acts as an edge synchronization circuit by means of which the edges of the RDS signal are synchronized with the edges of the oscillator signal OS. The RDS signal, with respect to its phase position, then is synchronized with the internal system of the RDS receiver.

FF3 and FF4 together act as a pulse shaping circuit limiting the signal occurring at the Q output of FF3 to a period of time corresponding to a half period of the 57 kHz oscillator signal OS. A half period of oscillator signal OS after connecting the falling edge of the RDS signal through to the Q output of FF3, FF4 generates a resetting signal at its Q output by means of which FF3 is reset again after this half period duration of OS. It is ensured thereby that frequency divider FT, at the resetting input thereof, receives a sufficiently short resetting pulse such that the resetting effect is maintained only during one period of the oscillator signal OS fed to frequency divider FT.

Figure 3:
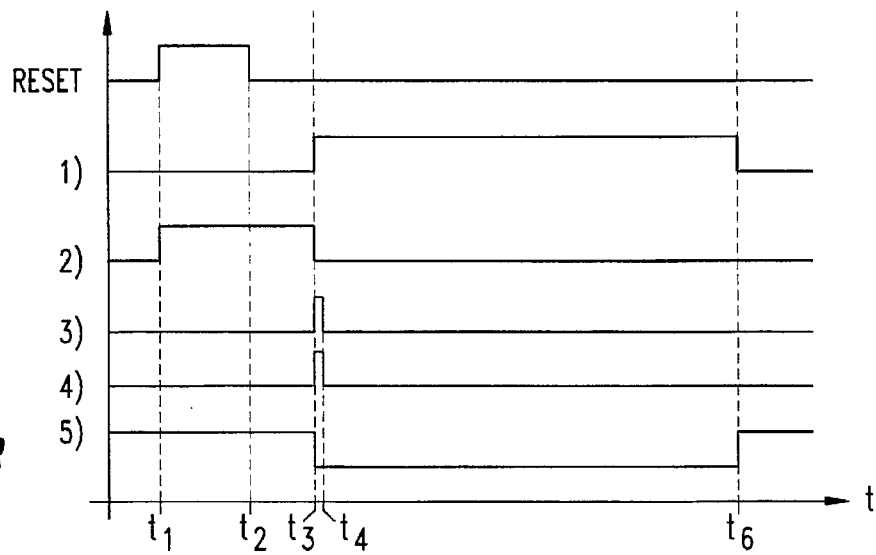
FIG. 3 is an illustration of signal patterns occurring at various locations of the block diagram shown in FIG. 2.

The mode of operation of the phase synchronization apparatus shown in FIG. 2 will now be elucidated in more detail with reference to FIG. 3. FIG. 3 shows signal patterns occurring at different locations of the circuit depicted in FIG. 2. The locations where the particular signal patterns occur are shown in FIGS. 2 and 3 by identical numbers.

It is assumed again that switching on of the RDS receiver or switching over thereof to a different transmitter receiving frequency from that received so far takes place at the time t1. The control circuit connected upstream of the clock input of flip-flop FF2 then generates the control signal RESET. This causes a transition of the Q output of FF2 to a high digital signal value starting as of t1. This high signal value is presented to the D-type input of FF3 starting as of t1.

At the time t3, the RDS signal 1, synchronized with the oscillator signal OS and delivered by the Q output of FF1, exhibits a rising edge from a low to a high digital signal value. This rising edge of the synchronized RDS signal 1 effects connecting through of the high signal value present at the D-type input of FF3 to the Q output of FF3. Signal 3 thus changes at the time t3 to a high signal value. This in turn effects a rise of the signal at the Q output of FF4 to a high signal value at the time t3, as can be seen by the signal pattern 4 in FIG. 3. The oscillator signal OS applied to the clock input of FF4 has the effect that the Q output of FF4, one half period of the 57 kHz oscillator signal later, changes again to a low signal value, as can be seen from the signal pattern 4 in FIG. 3. The falling edge at the Q output of FF4 causes resetting of FF3, resulting in a transition of the signal patterns 3 and 4 to the low signal value at the time t4. The resetting pulse supplied from the Q output of FF4 to the resetting input RES of frequency divider FT thus also has only a length corresponding to half of the period duration of the 57 kHz oscillator signal OS. Frequency divider FT thus is reset at the time t3 and from there starts a new counting operation so that the bit rate clock signal shown as signal pattern 5 in FIG. 3 exhibits at the time t3 a signal change from a high to a low signal value. Starting as of the time t3, the bit rate clock signal 5 is thus in phase synchronization with the RDS signal 1. Thus, at the time t6 the next edge change both of the RDS signal and of the bit rate clock signal takes place already at the same moment of time. As can be seen by patterns 1 and 5, the term phase synchronization is intended to include the case of aligning the rising edge of the RDS signal to the falling edge of the bit rate clock signal or vice versa.

As can be seen from the signal pattern RESET in FIG. 3, the control signal RESET, upon switching on or over of the RDS receiver, is delivered by the control circuit only for a predetermined duration from t1 to t2, which takes place only once after such an operation of switching on or over. Resetting of the frequency divider FT thus, after each operation of switching on or over of the RDS receiver, is possible only once and only during a maximum of one half bit duration of the RDS signal. For, at the latest at that time will the temporary storage flip-flop FF2 be reset again, and no further resetting of frequency divider FT can be caused any more. Disturbances occurring thereafter thus cannot make themselves felt. If a disturbance occurs during this short time of one RDS half bit duration, which erroneously imitates a transition edge of the RDS signal, nothing else will happen but that the instantaneous phase synchronization of the bit rate clock signal with the RDS signal will not be successful in this particular case, but is effected then by the conventional PLL latching operation.

Whether the phase synchronization operation according to the invention makes use of the next occurring rising edge or the next occurring falling transition edge of the RDS signal is a matter of discretion. The example shown in FIG. 1 starts from the assumption that the next falling transition edge of the RDS signal is employed for phase synchronization. On the other hand, the signal pattern generated by the circuit of FIG. 3 is based on the assumption that the next rising transition edge of the RDS signal is used for phase synchronization. A circuit to generate the signals of FIG. 1 can be implemented by placing an inverter between the RDS signal and the input to FF1, and using the rest of the circuit as shown in FIG. 2.

As will be appreciated, the time delay for a signal to propagate through a flip-flop (from the input D to the output Q) is very quick, usually on the order of a few nanoseconds or less. The frequency divider FT can be reset in a similar time period, in a few nanoseconds or less. Thus, the time delay from the transition of the RDS signal at the input of FF1 to the resetting of the output of the frequency divider FT at 5 is about three or four gate delays, the sum of which is likely under 10 nanoseconds. The output frequency is 1187.5 Hz; about 1.2 kHz. Thus, a phase synchronization that occurs within 10 nanoseconds is instantaneous compared to the clock frequency. The time delay of one flip-flop from FF3 to FF4 is not shown in FIG. 3 and is shown and described as being instantaneous because relative to the clock frequency of about 1.2 kHz, a time delay of a few nanoseconds is considered negligible.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A method of phase synchronization of a bit rate clock signal generated in an RDS receiver with a digital RDS signal that is demodulated on the receiver side, with the bit rate clock signal and the RDS signal having the same bit rate, characterized in that, upon switching on of the RDS receiver and/or upon switching over of the same to a transmitter receiving frequency different from that received so far, a control signal is generated which, upon occurrence of the next rising edge or, alternatively, of the next falling edge of the RDS signal, effects such a phase angle shift of the bit rate clock signal that the bit rate clock signal as of then is in phase synchronism with the RDS signal; and characterized in that the control signal generated upon switching on and/or over of the RDS receiver is stored temporarily and is released for phase angle shift of the bit rate clock signal by occurrence of the rising or falling edge of the RDS signal.

2. A method according to claim 1, characterized in that the temporary storage of the control signal is canceled during the process of the phase angle shift of the bit rate clock signal.

3. A method according to of claim 1, characterized in that the control signal is generated during the next falling edge of the RDS signal following switching on and/or over, and in that a frequency divider counter generating the bit rate clock signal is reset to its initial count by the control signal.

4. An apparatus for phase synchronization of a bit rate clock signal generated in an RDS receiver with an RDS signal demodulated on the receiver side, with the bit rate clock signal and the RDS signal having the same bit rate, said apparatus comprising:

an oscillator on the receiver side producing an oscillator signal, and a frequency divider counter having the oscillator signal fed to the input side thereof and delivering at its output the bit rate clock signal, characterized in that the frequency divider counter comprises a counter resetting input for resetting to an initial count, that a control means is provided adapted to generate a control signal upon switching on of the RDS receiver and/or switching over of the same to a different transmitter receiving frequency than that received so far, that a temporary storage is provided in which the control signal can be stored temporarily and which has a temporary storage resetting input for canceling the temporary storage contents, and in that an edge detector is provided which, upon occurrence of the rising or falling edge of the RDS signal, respectively, issues an edge detection signal causing reading out of the control signal stored in the temporary storage and transfer thereof to the counter resetting input and to the temporary storage resetting input.

5. An apparatus according to claim 4, characterized in that an edge synchronization circuit is provided having the oscillator signal and the RDS signal supplied to the input side thereof and delivering an RDS signal on the output side, whose edge effecting resetting of the frequency divider counter is in synchronization with an edge of the oscillator signal having the same direction, and in that the output of the edge synchronization circuit is connected to a signal input terminal of the edge detector.

6. An apparatus according to claim 5, characterized in that the edge synchronization circuit comprises a first D-type flip-flop whose D-type input receives the RDS signal, whose clock input has the oscillator signal applied thereto and whose output delivers the RDS signal that is edge-synchronized with the oscillator signal.

7. An apparatus according to claim 6, characterized in that the temporary storage comprises a second D-type flip-flop whose D-type input is on a constant logic value level, whose clock input receives the control signal from the control means, whose resetting input forming the temporary storage resetting input has the edge detection signal of the edge detector applied thereto and whose output delivers the control signal from the beginning of its occurrence until receipt of the edge detection signal at the resetting input.

8. An apparatus according to claim 7, characterized in that the edge detector comprises a third D-type flip-flop whose D-type input is connected to the output of the second D-type flip-flop, whose clock input has the RDS signal applied thereto, and whose output is connected on the one hand to the temporary storage resetting input and on the other hand to the counter resetting input.

9. An apparatus according to claim 8, characterized in that the pulse shaping circuit comprises the third D-type flip-flop and a fourth D-type flip-flop, with the D-type input of the fourth D-type flip-flop being connected to the output of the third D-type flip-flop, the clock input of the fourth D-type flip-flop being acted upon by the oscillator signal and the output of the fourth D-type flip-flop being connected on the one hand to the resetting input of the third flip-flop and on the other hand to the counter resetting input.

10. A bit PLL for an RDS receiver, characterized by a phase synchronization apparatus according to claim 4.

11. An RDS receiver, characterized by a bit PLL according to claim 10.

12. An RDS radio system comprising at least one transmitter transmitting RDS signal and at least one RDS receiver according to claim 11.

13. An apparatus according to claim 4, characterized in that the edge detector has a pulse shaping circuit associated therewith, by means of which the output signal of the edge detector is shaped to an edge detection pulse whose length in time is in the range of one half of the period duration of the oscillator signal.

14. A method of phase synchronization of a bit rate clock signal generated in an RDS receiver with a digital RDS signal that is demodulated on the receiver side, with the bit rate clock signal and the RDS signal having the same bit rate, the method comprising the steps of:

receiving a control signal that is generated upon switching over to a radio frequency different from the radio frequency being received by the RDS receiver;

temporarily storing the control signal;

shifting the phase angle of the bit rate clock signal in synchronism with the RDS signal upon occurrence of a transition edge of the RDS signal and when the stored control signal is read; and removing the temporarily stored control signal.

15. The method according to claim 14 wherein the step of temporarily storing includes the steps of:

providing a clock input of a flip-flop with the control signal; and holding a data input of the flip-flop at a predetermined logic state.

16. The method according to claim 14 wherein the step of removing the temporarily stored control signal includes resetting a flip-flop.

17. The method according to claim 14 wherein the step of removing is performed during the step of shifting the phase angle of the bit rate clock signal.

18. An apparatus for phase synchronization of a bit rate dock signal generated in an RDS receiver with an RDS signal demodulated on the receiver side, with the bit rate clock signal and the RDS signal having the same bit rate, the apparatus comprising:

an oscillator;

a frequency divider having an output, a reset input and a first input connected to the oscillator, the frequency divider generating the bit rate clock signal at its output;

an edge detector having an input receiving the RDS signal and generating at its output an edge detect signal upon detecting a transition edge of the RDS signal;

a temporary storage having a first input for receiving a control signal that is indicative of the RDS receiver switching to a radio frequency different from the radio frequency being received, the temporary storage having a reset input and an output; and a logic circuit having a first input connected to the edge detector output, a second input connected to the temporary storage output, a first output connected to the frequency divider reset input, and a second output connected to the temporary storage reset input, the logic circuit operable to generate at its first and second outputs a reset signal when the edge detector generates the edge detect signal and when the temporarily stored control signal is read.

19. The apparatus according to claim 18 wherein the logic circuit includes a pulse shaping circuit generating the reset signal having a pulse width of less than one period of an oscillator signal generated by the oscillator.

20. The apparatus according to claim 18 wherein the edge detector circuit has a clock input connected to the oscillator.

21. The apparatus according to claim 18 wherein the logic circuit comprises:

a first storage having a first input connected to the edge detector output, a second input connected to the temporary storage output, and an output; and a second storage having a first input connected to the first storage output, a second input connected to the oscillator, and an output connected to the frequency divider reset input.

22. The apparatus according to claim 21 wherein the first storage output is connected to the temporary storage reset input.

23. An RDS radio system comprising:

an RDS transmitter transmitting an RDS signal; and an RDS receiver receiving the RDS signal, the RDS receiver including a phase synchronization circuit to synchronize a bit rate clock signal generated in the RDS receiver with the RDS signal demodulated on the receiver side, the bit rate clock signal and the RDS signal having the same bit rate, the phase synchronization circuit including:

an oscillator;

a frequency divider having a reset input and a first input connected to the oscillator, the frequency divider generating the bit rate clock signal at its output;

an edge detector having an input receiving the RDS signal and generating at its output an edge detect signal upon detecting a transition edge of the RDS signal;

a temporary storage having a first input for receiving a control signal generated upon switching over of the RDS receiver to a radio frequency different from the radio frequency being received, the temporary storage having a reset input and an output; and a logic circuit having a first input connected to the edge detector output, a second input connected to the temporary storage output, a first output connected to the frequency divider reset input, and a second output connected to the temporary storage reset input, the logic circuit operable to generate at its first and second outputs a reset signal when the edge detector generates the edge detect signal and when the temporarily stored control signal is read.

* * * * *

UNITED STATES PATENT AND TRADEMARK OFFICE
CERTIFICATE OF CORRECTION

PATENT NO. : 5,636,249
DATED : June 3, 1997
INVENTOR(S) : Gerhard Roither

It is certified that error appears in the above-identified patent and that said Letters Patent is hereby corrected as shown below:

On the cover page under item [75] after "Roither," delete "Müchen," and substitute therefor -- München, --.

In column 8, claim 18, line 31, delete "dock" and substitute therefor --clock --.

Signed and Sealed this

Thirteenth Day of October 1998

Attest:

BRUCE LEHMAN

Attesting Officer

Commissioner of Patents and Trademarks